(12) United States Patent
Wang et al.

(10) Patent No.: US 8,390,086 B2
(45) Date of Patent: Mar. 5, 2013

(54) SOLAR CELL EMPLOYING A NANOWIRE

(75) Inventors: Shih-Yuan Wang, Palo Alto, CA (US); Nobuhiko Kobayashi, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 196 days.

(21) Appl. No.: 12/815,590

(22) Filed: Jul. 19, 2010

(65) Prior Publication Data

US 2011/0023948 A1 Feb. 3, 2011

Related U.S. Application Data

(63) Continuation of application No. 11/439,011, filed on May 22, 2006, now Pat. No. 7,741,647.

(51) Int. Cl.
 *H01L 31/042* (2006.01)
(52) U.S. Cl. ......... 257/431; 257/E31.015; 257/E31.019; 257/E31.023; 438/93; 977/762
(58) Field of Classification Search .............. 257/431, 257/466, E31.023, E31.015, E31.019; 438/93; 977/762
See application file for complete search history.

(56) References Cited

U.S. PATENT DOCUMENTS

| | | | |
|---|---|---|---|
| 7,181,836 B2 * | 2/2007 | Tsakalakos | 29/846 |
| 7,255,745 B2 * | 8/2007 | Zhang et al. | 117/94 |
| 7,449,776 B2 * | 11/2008 | Wang et al. | 257/714 |
| 7,553,371 B2 * | 6/2009 | Dubrow et al. | 117/90 |
| 2004/0213307 A1 | 10/2004 | Lieber | |
| 2005/0009224 A1 | 1/2005 | Yang | |
| 2005/0064618 A1 | 3/2005 | Brown | |
| 2005/0079659 A1 | 4/2005 | Duan | |
| 2005/0133254 A1 | 6/2005 | Tsakalakos | |
| 2005/0133476 A1 | 6/2005 | Islam | |
| 2005/0176228 A1 | 8/2005 | Fonash | |
| 2005/0181587 A1 * | 8/2005 | Duan et al. | 438/551 |
| 2006/0019472 A1 | 1/2006 | Pan | |
| 2006/0038182 A1 | 2/2006 | Rogers | |
| 2006/0151820 A1 * | 7/2006 | Duan et al. | 257/296 |
| 2006/0204738 A1 | 9/2006 | Dubrow | |
| 2007/0228439 A1 * | 10/2007 | Duan et al. | 257/296 |
| 2008/0218740 A1 * | 9/2008 | Williams et al. | 356/72 |

FOREIGN PATENT DOCUMENTS

| | | |
|---|---|---|
| JP | 1992-296060 | 10/1992 |
| JP | 2003-258278 | 9/2003 |
| JP | 2003-282906 | 10/2003 |
| JP | 2003-289151 | 10/2003 |
| JP | 2004-128331 | 4/2004 |
| JP | 2005-507146 | 3/2005 |
| JP | 2005-352571 | 12/2005 |
| JP | 2006-114704 | 4/2006 |
| JP | 2007-184566 | 7/2007 |
| JP | 2008-544536 | 12/2008 |
| JP | 2008-544567 | 12/2008 |

(Continued)

OTHER PUBLICATIONS

Dictionary.com. LLC, Photodetector, retrieved Nov. 29, 2011.*

(Continued)

*Primary Examiner* — Allan R Wilson
(74) *Attorney, Agent, or Firm* — David W. Collins (57) ABSTRACT

One embodiment in accordance with the invention is a solar cell comprising a non-single crystal substrate; a nanowire grown from a surface of the non-single crystal substrate; and an electrode coupled to the nanowire, wherein the nanowire is electrically conductive and is for absorbing electromagnetic wave and generating a current.

15 Claims, 7 Drawing Sheets

FOREIGN PATENT DOCUMENTS

| JP | 2009-505415 | 2/2009 |
|---|---|---|
| JP | 2009-542560 | 12/2009 |
| WO | WO-2004/006969 | 1/2004 |
| WO | 2005017962 | 2/2005 |
| WO | WO-2006/018575 | 2/2006 |

OTHER PUBLICATIONS

Wendy U. Huynh et al. "Hybrid Nanorod-Polymer Solar Cells." Science, vol. 295 (Mar. 29, 2002), pp. 2425-2427.

Chin-Ching Lin, et al.; "Enhanced Luminescent and Electrical Properties of Hydrogen-Plasma ZnO Nanorods Grown on Wafer-Scale Flexible Substrates"; Applied Physics Letters 86, 183103, Apr. 25, 2005, National Chiao Tung University.

Pu Xian Gao, et al.; "Three-Dimensional Interconnected Nanowire Networks of ZnO"; Chemical Physics Letters 408 (2005) 174-178; available online at www.sciencedirect.com, Apr. 1, 2005.

Hari Chandrasekaran, et al.; "Growth of Gallium Nitride Textured Fils and Nanowires on Polycrystalline Substrates at Sub-Atmoshpheric Pressures"; Dept of Chemcal Engineering, University of Louisville, KY.

Sreeram Vaddiraju,et al.; "Mechanisms of 1D Crystal Growth in Reactive Vapor Transport: Indium Nitride Nanowires"; Nano Letters, vol. 0, No. 0, A-G; Jun. 15, 2005.

Partial International Search Report; PCT Patent Application No. PCT/US2007/012273, filed May 22, 2007; search issued by European Patent Office (ISA) Oct. 29, 2008.

International Search Report; PCT Patent Application No. PCT/US2007/012273, filed May 22, 2007; search issued by European Patent Office (ISA) Feb. 24, 2009.

Sacilotti, et al. "Structural studies of nano/micrometric semiconducting GaInP wires grown by MOCVD", Journal of Crystal Growth, Elsevier, Amsterdam, NL, Dec. 10, 2004.

Sunkara, et al. "Direction dependent homoexpitaxial growth and bandgap of GaN nanowires", Proc. of SPIE, Feb. 9, 2006.

\* cited by examiner

```
┌─────────────────────────────────────┐
│ Dispose a material above a non-single crystal │
│ substrate.                          │
│ 602                                 │
└─────────────────────────────────────┘
                  │
                  ▼
┌─────────────────────────────────────┐
│ Dispose one or more nanowires above the │
│ material and the non-single crystal substrate. │
│ 604                                 │
└─────────────────────────────────────┘
                  │
                  ▼
┌─────────────────────────────────────┐
│ Dispose an insulating material above at least a │
│ portion of the one or more nanowires, the │
│ material, and the non-single crystal substrate. │
│ 606                                 │
└─────────────────────────────────────┘
                  │
                  ▼
┌─────────────────────────────────────┐
│ Couple an electrode to the one or more │
│ nanowires for conducting current.   │
│ 608                                 │
└─────────────────────────────────────┘
```

```
┌─────────────────────────────────────┐
│ One or more protruding portions can be │
│ formed in association with a non-single │
│        crystal substrate.            │
│              702                     │
└─────────────────────────────────────┘
                  │
                  ▼
┌─────────────────────────────────────┐
│ One or more nanowires can be formed between │
│ at least a first protruding portion and a second │
│         protruding portion.          │
│              704                     │
└─────────────────────────────────────┘
                  │
                  ▼
┌─────────────────────────────────────┐
│ At least one of the first and second protruding │
│ portions can be biased to cause the apparatus │
│      to operate in a particular manner. │
│              706                     │
└─────────────────────────────────────┘
```

FIG. 7

SOLAR CELL EMPLOYING A NANOWIRE

CROSS-REFERENCE TO RELATED APPLICATION

The present application is a continuation application of application Ser. No. 11/439,011, filed May 22, 2006, now U.S. Pat. No. 7,741,647 the contents of which are incorporated by reference herein.

BACKGROUND

Currently, conventional solar cell manufacturing techniques typically start with very high quality single crystal substrates such as silicon in order to produce a solar cell having high efficiency. Otherwise, if a non-single crystal substrate is used, then the efficiency of the solar cell decreases. However, there are disadvantages associated with this type of conventional solar cell manufacturing technique.

For example, one disadvantage is that the demand for high quality single crystal silicon substrates for manufacturing solar cells is currently so large that these substrates are in short supply. As such, manufacturing solar cells can be very costly, and could occasionally be impossible, as the demands for solar cells based on single crystal substrates increases, due to the scarcity of the high quality single crystal silicon substrates.

Therefore, it is desirable to address one or more of the above issues.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Figure 1:
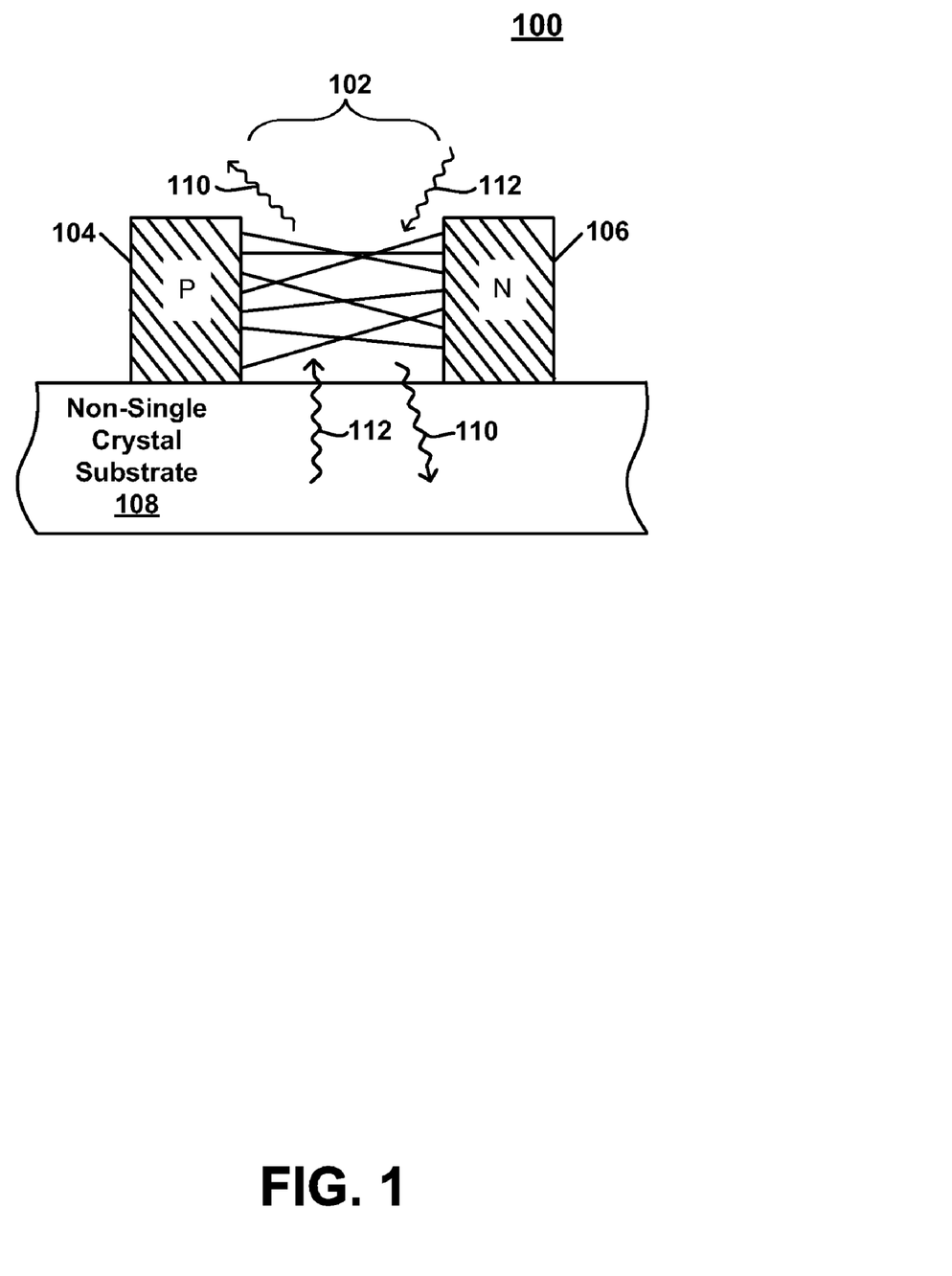
FIG. 1 is a side section view of an exemplary apparatus that includes one or more nanowires in accordance with various embodiments of the invention.

FIG. 1 is a side section view of an exemplary apparatus 100 that includes one or more nanowires 102 grown (or formed) in a "bridging" configuration in accordance with various embodiments of the invention. Specifically, within apparatus 100, one or more single crystalline nanowires 102 (represented by each straight line) can be grown on non-single crystalline material surfaces 104 and 106 (e.g., polycrystalline silicon, amorphous silicon, poly-crystal (grain size is in the range of micro meter to nano meter) diamond and related carbon-based materials and/or microcrystalline silicon), which is typically an inexpensive material. As such, the manufacturing costs of apparatus 100 can be greatly reduced since it does not involve expensive materials (e.g., single crystalline silicon). Once manufactured, apparatus 100 can be forward biased thereby causing nanowires 102 to emit light 110 (e.g., becoming optically active), and enabling apparatus 100 to be used as part of a display device (not shown). Moreover, if apparatus 100 is not biased, nanowires 102 can each absorb electromagnetic wave having a wide range of energy (or more) 112 and convert it into electrical current (e.g., becoming electrically conductive), thereby enabling apparatus 100 to be used as part of a solar cell (or photovoltaic cell). Furthermore, if apparatus 100 is reverse biased, nanowires 102 can each absorb electromagnetic wave having a wide range of energy (or more) 112 and convert it into electrical current with higher speed and efficiency than at zero bias, thereby enabling apparatus 100 to be used as part of a radiation detector. By utilizing apparatus 100 in these different applications, the manufacturing costs of these devices can be greatly reduced.

It is further noted that apparatus 100 can be used for a wide variety of light sources. For example in various embodiments, the nanowires 102 can emit "light" 110 within, but is not limited to, the infrared wavelengths, the visible light wavelengths, the ultraviolet (UV) wavelengths, and any electromagnetic wavelength. Additionally, the nanowires 102 of apparatus 100 can be used as a gain region to produce laser light 110 by being appropriately placed in an optical cavity as in a conventional laser structure.

Within FIG. 1, since the nanowires 102 of apparatus 100 can be implemented to produce different colors of visible light 110, a plurality of apparatuses 100 can be utilized to generate light for a display device, such as a flat panel display. For example within one embodiment, three different apparatuses 100 can be used for each pixel of the display. Specifically, the nanowires 102 of a first apparatus 100 can be implemented with material that generates red light for a display pixel, the nanowires 102 of a second apparatus 100 can be implemented with material that generates green light for the display pixel, and the nanowires 102 of a third apparatus 100 can be implemented with material that generates blue light for the display pixel. The first, second and third apparatuses 100 can then be driven, for example, by amorphous thin film transistors often found in a conventional liquid crystal display, but are not limited to such. Additionally, a plurality of apparatuses 100 can be utilized for display arrays. It is pointed out that for a solar cell application, the nanowires of apparatus 100 can be implemented with all different types of materials in one cell since they are used to absorb light (and/or any electromagnetic wave) 112 having a wide range of spectrum.

It is noted that when apparatus 100 is utilized as a light emitter, a radiation/light detector or as a photovoltaic cell, its single crystal nanowires 102 exhibit all the properties of single crystalline semiconductors, but apparatus 100 can be fabricated with inexpensive materials, such as, a non-single crystalline substrate 108 that can be implemented with, but is not limited to, glass, Mylar®, quartz, metal, steel, stainless steel, and/or other inexpensive substrate materials. Furthermore, the protruding portions 104 and 106 can also be fabricated with inexpensive materials, as long as the surface of the materials possess physical characteristics that enable the growth of nanowires, such as but not limited to, polycrystalline silicon, amorphous silicon, poly-crystal (grain size is in the range of micro meter to nano meter) diamond and related carbon-based materials, microcrystalline silicon, and/or any material that can withstand nanowire growth temperatures (e.g., which can be approximately 500 degrees Celsius). Low temperature growth techniques such as plasma enhanced chemical vapor deposition can bring the nanowire growth temperature significantly lower than 500 C. As such, apparatus 100 is inexpensive to manufacture and yet its nanowires 102 retain the single crystalline properties for an efficient solar cell, radiation/light detector or light emitter. Note that a display device (not shown) can include one or more apparatuses 100 for emitting light. Furthermore, a solar cell can include one or more apparatuses 100 for absorbing light having a wide range of spectrum (or any electromagnetic wave) and converting it into an electrical current for further improvement in efficiency. Moreover, a radiation/light detector can include one or more apparatuses 100.

Within FIG. 1, as noted above, the manufacturing of apparatus 100 can be inexpensive. Additionally, in accordance with an embodiment, the non-single crystal substrate material 108 that is part of apparatus 100 could come off a roll. As such, the manufacturing of multiple apparatuses 100 can be implemented with a roll manufacturing process. Moreover, since the non-single crystal substrate material 108 can include light weight materials, such as Mylar®, the resultant apparatus 100 can be light weight. Additionally, the nanowires 102 can be grown dense enough to capture light (or any electromagnetic wave), but there can be a lot of air space between the nanowires 102 thereby making it light weight. This can be desirable when dealing with applications where weight is an issue, such as outer space applications. For example in accordance with one embodiment, a plurality of apparatuses 100 fabricated on Mylar to function as solar cells could be coiled into a tight roll and not add much weight to its associated spacecraft or satellite. Once the space craft or satellite reaches outer space, the solar cell roll can then be unraveled and provide its desired functionality.

Since apparatus 100 can be fabricated on a transparent substrate 108, a plurality of apparatuses 100 can be used in situations where it is desirable to have solar cell application, but also desirable to have some transparency. For example, one or more apparatuses 100 including a transparent non-single crystal substrate film 108 can be applied to windows, skylight on roofs, and anywhere else. Note that for a display device, the apparatus 100 can output light (or any electromagnetic wave) 110 in different directions, including through a transparent non-single crystal substrate 108. It is understood that for a solar cell (or a photovoltaic cell or a radiation/light detector), the apparatus 100 can receive light (or any electromagnetic wave) 112 from different directions, including through a transparent non-single crystal substrate 108. It is appreciated that if the apparatus 100 solar cells are going to be put on an opaque roof, there may not be a need for it to have a transparent substrate 108. Instead, the substrate 108 can be implemented with a good heat conductor, such as, thin aluminum or stainless steel sheets that are also durable.

Within FIG. 1, the apparatus 100 can include protruding portions 104 and 106, which can each be fabricate with any of the wide variety of materials mentioned herein, but is not limited to such. The protruding portions 104 and 106 can also be referred to as walls, columns, and the like. It is noted that the protruding portions 104 and 106 can be disposed on (or coupled to) the non-single crystalline substrate 108 in any manner. The single crystal nanowires 102 can each be grown (or generated) from the non-single crystal protruding portion 104 towards protruding portion 106, or vice-versa. One or more of the single crystal nanowires 102 can be grown (or generated) from the non-single crystal protruding portion 104 towards protruding portion 106 while one or more of the single crystal nanowires 102 can be grown (or generated) from the non-single crystal protruding portion 106 towards protruding portion 104. In any of these situations, the nanowires 102 can each have electrical contact (or be electrically coupled) at both of its ends. As such, the nanowires 102 of apparatus 100 can be referred to as a bridging configuration. It is understood that each of nanowires 102 can be grown (or generated) having a random orientation. Nanowires 102 can be grown (or generated) such that they are oriented with each other and/or in a particular direction. It is noted that the nanowires 102 of apparatus 100 are able to combine the advantages (e.g., high photon-to-electron conversion efficiency) of single crystal semiconductor properties with a non-single crystalline substrate 108 and other non-single crystalline materials 104 and 106. It is pointed out that even though protruding portions 104 and 106 are composed of non-single crystalline material, nanowires 102 are able to be grown as single crystal structures because of their one-dimensional structural characteristics with extremely small diameter. The material of protruding portions 104 and 106 can be heavily doped (e.g., with boron and phosphorus for amorphous and/or microcrystalline silicon) such that they will be electrodes and/or they will generate built-in potential within nanowires 102.

The protruding portion 104 can be fabricated with p-type material while the protruding portion 106 can be fabricated with n-type material. As such, forward biasing can be applied to the p-type material of protruding portion 104 thereby causing nanowires 102 to emit light 110 (or any electromagnetic wave). However, if no bias is applied to apparatus 100, the built-in potential within the nanowires 102 will separate excess electrons and holes generated by absorbing light (or any electromagnetic wave) to cause electrical current to flow through external circuits that could be connected or coupled to apparatus 100.

It is noted that the nanowires 102 of apparatus 100 can each be implemented with any type of nanowire (e.g., material, configuration, and/or the like). For example, each nanowire 102 can be implemented with at least, but is not limited to, a metal, a group III-V compound semiconductor material (e.g., GaAs, GaN, InP, etc.) and related alloys, a group II-VI compound semiconductor material (e.g., ZnO, CdSe, etc.) and related alloys, a group IV semiconductor material (e.g., Si, germanium (Ge), SiGe, etc.) and related alloys, and/or the like. Furthermore, the composition of nanowires 102 can be intrinsic or each can be partially doped. For example, each nanowire 102 can be doped as n-type material, p-type material, or undoped. Moreover, the nanowires 102 can be made out of one material like a GaAs or related alloys. Also, nanowires 102 can contain different sections. For example, one or more of nanowires 102 can have a section made out of a first material and a second section made out a second material, and so forth, thereby resulting in one or more of hetero-material nanowire 102. Additionally, one or more of nanowires 102 can be concentric wherein it has a cylindrical core of a first material that can be coated with a second material, and so forth. It is pointed out that the various embodiments in accordance with the invention can be implemented with any type of nanowire.

Within FIG. 1, it is pointed out that another advantage of apparatus 100 is that the growth time of nanowires 102 can be short (e.g., approximately 30 seconds to a minute to grow an active region of approximately 1 micrometer). As such, this is a factor that contributes to a lower overall processing time of apparatus 100. In comparison, a typical light emitting diode (LED) and a laser each involves a growth time of 3 to 4 hours. So the manufacturing time of apparatus 100 is very short which makes it very attractive as a light emitter, radiation/light detector, and a solar cell.

Figure 2:
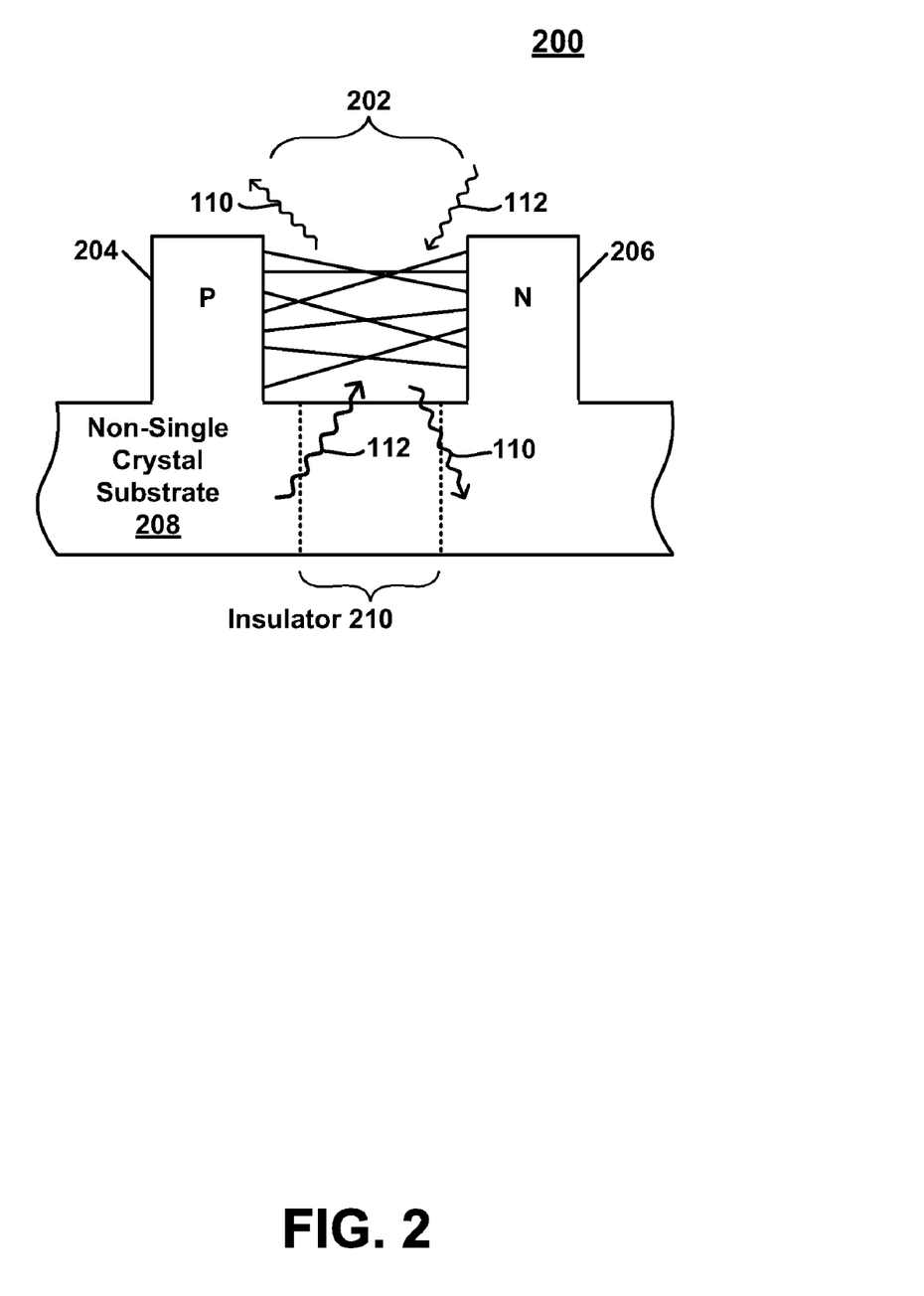
FIG. 2 is a side section view of another exemplary apparatus that includes one or more nanowires in accordance with various embodiments of the invention.

FIG. 2 is a side section view of an exemplary apparatus 200 that includes one or more nanowires 202 grown in a "bridging" configuration in accordance with various embodiments of the invention. It is noted that apparatus 200 is similar to apparatus 100 of FIG. 1. However, the protruding portions 204 and 206 of apparatus 200 of FIG. 2 are formed from the same material as the non-single crystal substrate 208. Furthermore, apparatus 200 also includes an insulator 210 that electrically separates the p-type material of substrate 208 from its n-type material, thereby enabling electrical current to flow through nanowires 202 without having electric shortage within the non-single crystal substrate 208.

Specifically, single crystal nanowires 202 can be grown from protruding portion 204 of substrate 208 towards protruding portion 206, or vice versa. One or more single crystal nanowires 202 can grow from one or both of protruding portions 204 and 206 to eventually couple with the other protruding portion.

Within FIG. 2, it is understood that nanowires 202 can be implemented in any manner similar to that described herein with reference to nanowires 102. Additionally, nanowires 202 can operate in any manner similar to that described herein with reference to nanowires 102. Moreover, the non-single crystal substrate 208 can be implemented in any manner similar to that described herein with reference to the non-single crystal substrate 108.

The apparatus 200 can include protruding portions 204 and 206, which can each be fabricated with any of the wide variety of materials mentioned herein, but is not limited to such. The protruding portions 204 and 206 can also be referred to as walls, columns, and the like. The nanowires 202 can each have electrical contact (or be electrically coupled) at both of its ends. As such, the nanowires 202 of apparatus 200 can be referred to as a bridging configuration. It is noted that the nanowires 202 of apparatus 200 are able to combine the advantages (e.g., high photon-to-electron conversion efficiency) of single crystal semiconductor properties with a non-single crystalline substrate 208. It is pointed out that even though protruding portions 204 and 206 are composed of non-single crystalline material, nanowires 202 are able to be grown as single crystal structures because of their one-dimensional structural characteristics with extremely small diameter. The material of protruding portions 204 and 206 can be heavily doped (e.g., with boron and phosphorous for amorphous or microcrystalline silicon) such that they will be electrodes and/or they will generate built-in potential within nanowires 202.

Figure 3:
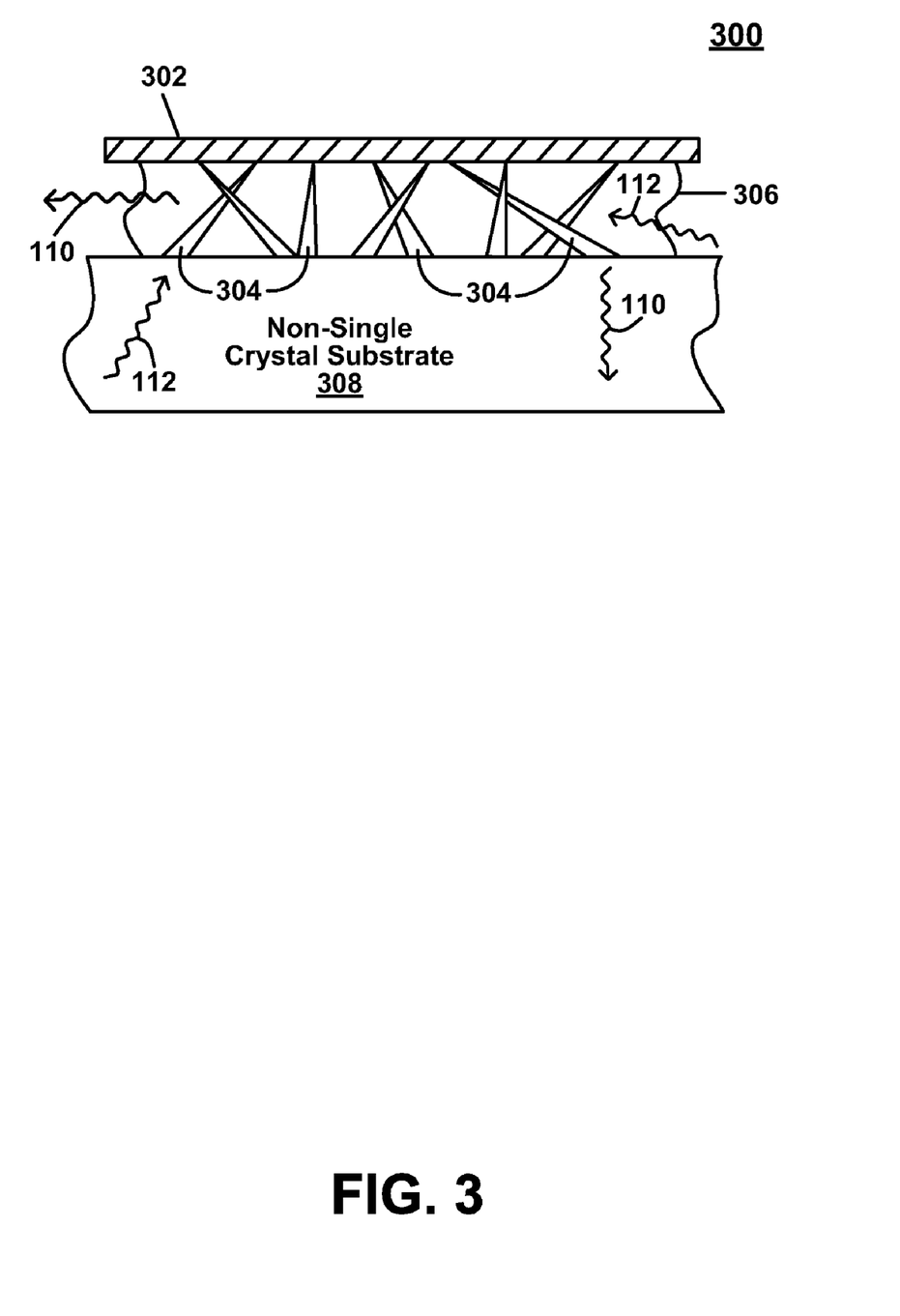
FIG. 3 is a side section view of yet another exemplary apparatus that includes one or more nanowires in accordance with various embodiments of the invention.

FIG. 3 is a side section view of an exemplary apparatus 300 that includes one or more nanowires 304 grown in a "virtual bridging" configuration in accordance with various embodiments of the invention. Specifically, note that the nanowires 304 of apparatus 300 can be grown to a desired length on a non-single crystalline substrate 308. Subsequently, a layer of insulator material 306 can be disposed such that it substantially fills in the gaps between the nanowires 304. An electrode 302 (e.g., gold germanium, silicon gold, or other ohmic metal contact) can then be coupled to the nanowires 304, which means there is now an electrical connection from the top of each nanowire 304 to its bottom that is coupled to the non-single crystalline substrate 308.

Note that nanowires 304 of apparatus 300 can be implemented in any manner similar to that described herein with reference to nanowires 102. Moreover, nanowires 304 can operate in any manner similar to that described herein with reference to nanowires 102. Furthermore, the non-single crystal substrate 308 can be implemented in any manner similar to that described herein with reference to the non-single crystal substrate 108.

Within FIG. 3, the nanowires 304 can each have electrical contact (or be electrically coupled) at both of its ends. As such, the nanowires 304 of apparatus 300 can be referred to as a virtual bridging configuration. It is noted that the nanowires 304 of apparatus 300 are able to combine the advantages (e.g., high photon-to-electron conversion efficiency) of single crystal semiconductor properties with a non-single crystalline substrate 308. It is pointed out that even though substrate 308 is composed of non-single crystalline material, nanowires 304 are able to be grown as single crystal structures because of their one-dimensional characteristics with extremely small diameter.

It is understood that apparatus 300 can be utilized with display technology. For example, the nanowires 304 of a first apparatus 300 can be fabricated with material that generates red light 110 for a display pixel, the nanowires 304 of a second apparatus 300 can be implemented with material that generates green light 110 for the display pixel, and the nanowires 304 of a third apparatus 300 can be implemented with material that generates blue light 110 for the display pixel. In this manner, each pixel of the display can have 3 biased points, so each pixel can have 3 electrically separate elements (e.g., apparatus 300). Additionally, a plurality of apparatuses 300 can be utilized for display arrays.

Figure 4:
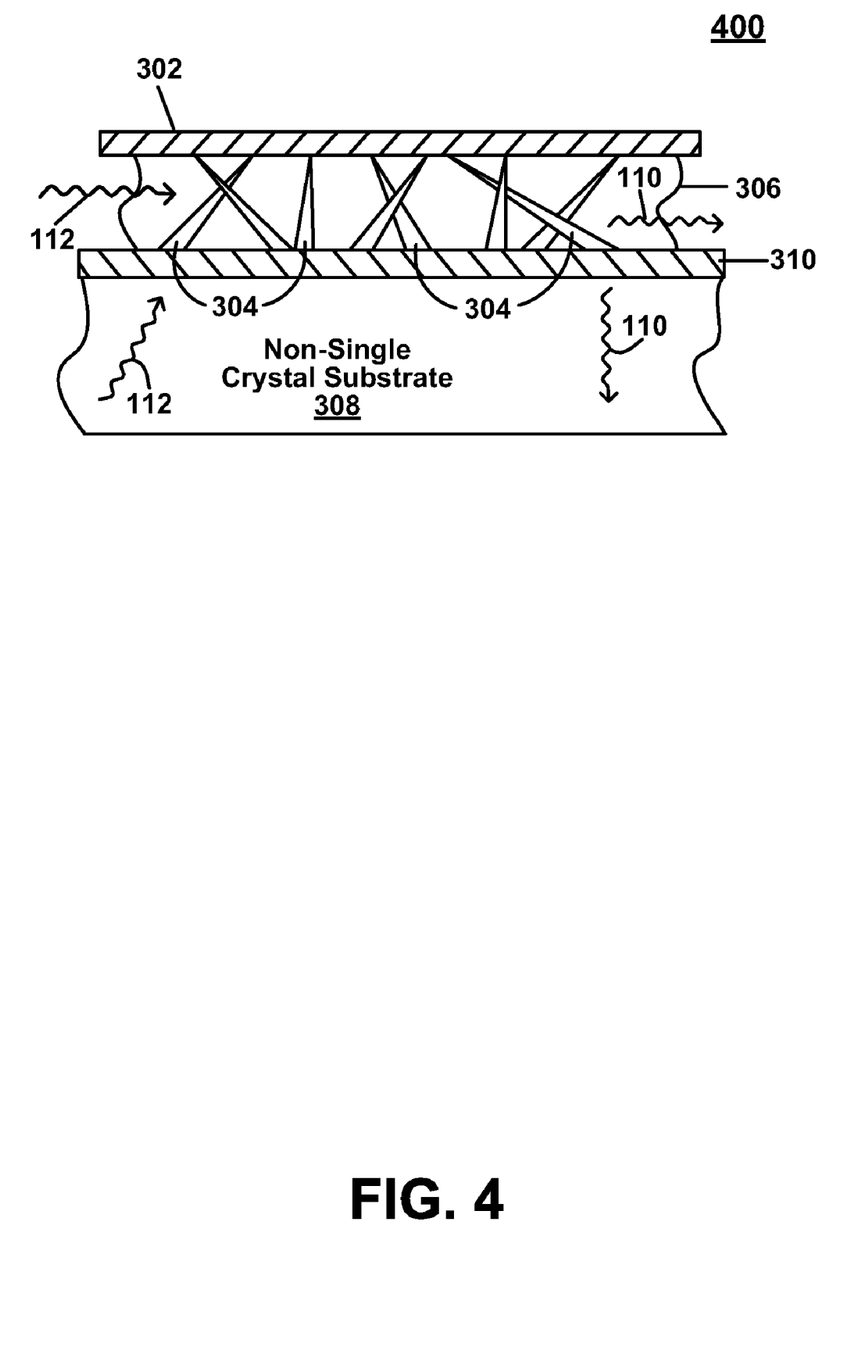
FIG. 4 is a side section view of still another exemplary apparatus that includes one or more nanowires in accordance with various embodiments of the invention.

FIG. 4 is a side section view of an exemplary apparatus 400 that includes one or more nanowires 304 grown in a "virtual bridging" configuration in accordance with various embodiments of the invention. It is noted that apparatus 400 is similar to apparatus 300 of FIG. 3. However, the nanowires 304 of apparatus 400 are grown on a layer of non-single crystalline material 310. It is understood that the layer of non-single crystalline material 310 can be implemented with any material or materials similar to the described herein with reference to the non-single crystalline material surfaces 104 and 106, but is not limited to such. For example, material layer 310 can be implemented with, but is not limited to, microcrystalline silicon (μc-Si).

It is appreciated that nanowires 304 of apparatus 400 can be implemented in any manner similar to that described herein with reference to nanowires 102. Moreover, nanowires 304 of FIG. 4 can operate in any manner similar to that described herein with reference to nanowires 102. Furthermore, the non-single crystal substrate 308 can be implemented in any manner similar to that described herein with reference to the non-single crystal substrate 108.

Within FIG. 4, the nanowires 304 can each have electrical contact (or be electrically coupled) at both of its ends. As such, the nanowires 304 of apparatus 400 can be referred to as a virtual bridging configuration. It is noted that the nanowires 304 of apparatus 400 are able to combine the advantages (e.g., high photon-to-electron conversion efficiency) of single crystal semiconductor properties with a non-single crystalline layer 310 and substrate 308. It is pointed out that even though layer 310 is composed of non-single crystalline material, nanowires 304 are able to be grown as single crystal structures because of their one-dimensional structural characteristics with extremely small diameter. It is understood that apparatus 400 can be utilized in any manner similar to apparatus 300 described herein.

Figure 5:
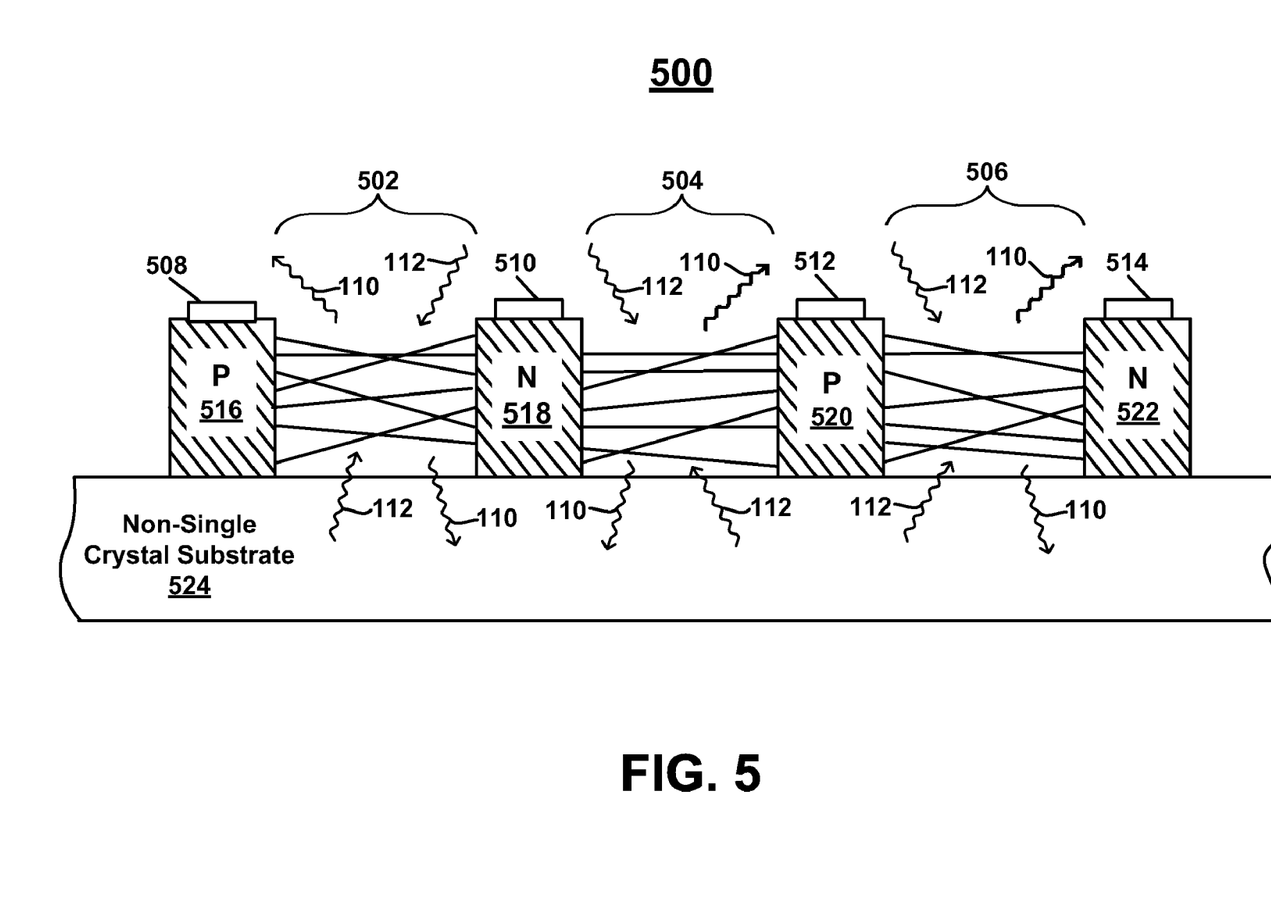
FIG. 5 is a side section view of another exemplary apparatus that includes one or more nanowires in accordance with various embodiments of the invention.

FIG. 5 is a side section view of an exemplary apparatus 500 that includes one or more nanowires 502, 504 and 506 grown in a "bridging" configuration in accordance with various embodiments of the invention. Specifically, apparatus 500 illustrates a configuration that can be utilized for solar cells and/or radiation/light detectors in accordance with various embodiments of the invention, but is not limited to such.

It is noted that protruding portions 516 and 518 (along with nanowires 502) can be implemented and operate in any manner similar to that described herein with reference to protruding portions 104 and 106 (and nanowires 102) of FIG. 1. Furthermore, protruding portions 518 and 520 (along with nanowires 504) can be implemented and operate in any manner similar to that described herein with reference to protruding portions 104 and 106 (and nanowires 102) of FIG. 1. Moreover, protruding portions 520 and 522 (along with nanowires 506) can be implemented and operate in any manner similar to that described herein with reference to protruding portions 104 and 106 (and nanowires 102) of FIG. 1. However, it is noted that protruding portions 516, 518, 520 and 522 each are coupled to an electrode 508, 510, 512 and 514, respectively. The electrodes 508, 510, 512 and 514 (which can each be implemented in any manner similar to that described herein with reference to electrode 302) are coupled at the "top" of each protruding portions 516, 518, 520 and 522 thereby enabling each to be electrically coupled to other circuitry (e.g., associated with solar cell functionality). Furthermore, the non-single crystal substrate 524 can be implemented in any manner similar to that described herein with reference to the non-single crystal substrate 108.

It is pointed out that there are other configurations of nanowire "bridging" in accordance with various embodiments of the invention that are not specifically shown herein. Note that the various embodiments in accordance with the invention are not limited to those nanowire bridging configurations shown herein.

Figure 6:
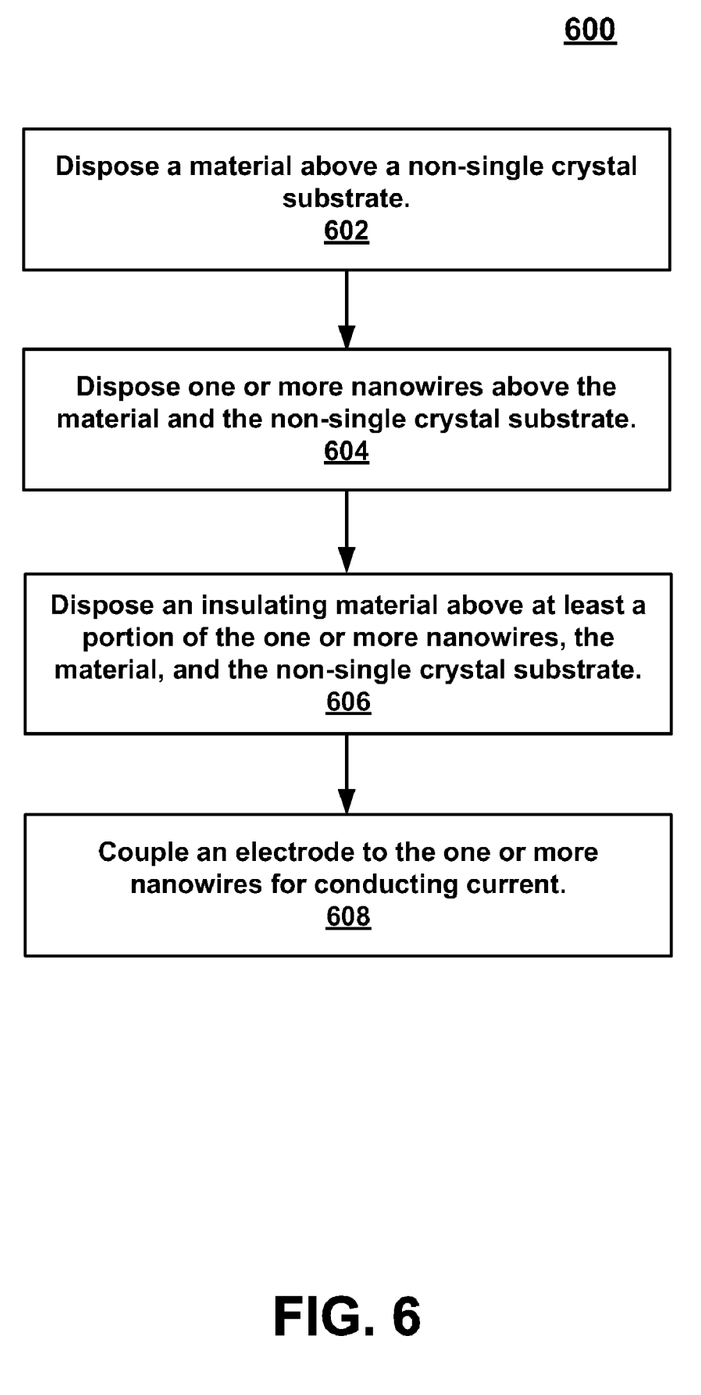
FIG. 6 is a flow diagram of a method in accordance with various embodiments of the invention.

FIG. 6 is a flow diagram of a method 600 for fabricating an apparatus that includes one or more nanowires in accordance with various embodiments of the invention. Method 600 includes exemplary processes of various embodiments of the invention that can be carried out by a processor(s) and electrical components under the control of computing device readable and executable instructions (or code), e.g., software. The computing device readable and executable instructions (or code) may reside, for example, in data storage features such as volatile memory, non-volatile memory and/or mass data storage that can be usable by a computing device. However, the computing device readable and executable instructions (or code) may reside in any type of computing device readable medium. Although specific operations are disclosed in method 600, such operations are exemplary. Method 600 may not include all of the operations illustrated by FIG. 6. Also, method 600 may include various other operations and/or variations of the operations shown by FIG. 6. Likewise, the sequence of the operations of method 600 can be modified. It is noted that the operations of method 600 can be performed by software, by firmware, by electronic hardware, or by any combination thereof.

Specifically, a material can be disposed above a non-single crystal substrate. One or more nanowires can be disposed above the material and the non-single crystal substrate. An insulating material can be disposed above at least a portion of the one or more nanowires, the material, and the non-single crystal substrate. An electrode can be coupled to the one or more nanowires for conducting current. In this manner, an apparatus can be fabricated that can include one or more nanowires in accordance with various embodiments of the invention.

At operation 602 of FIG. 6, a material (e.g., 310) can be disposed above a non-single crystal substrate (e.g., 308). Note that operation 602 can be implemented in a wide variety of ways. For example, the material can include, but is not limited to, polycrystalline silicon, amorphous silicon, poly-crystal (grain size is in the range of micro meter to nano meter) diamond and related carbon-based materials, microcrystalline silicon, and/or the like. It is appreciated that operation 602 can be implemented in any manner similar to that described herein, but is not limited to such.

At operation 604, one or more nanowires (e.g., 304) can be disposed above the material and the non-single crystal substrate. It is understood that operation 604 can be implemented in a wide variety of ways. For example, the one or more nanowires can include at least, but is not limited to, a metal, a group III-V compound semiconductor material and related alloys, a group II-VI compound semiconductor material and related alloys, a group IV semiconductor material and related alloys, and/or the like. It is noted that operation 604 can be implemented in any manner similar to that described herein, but is not limited to such.

At operation 606 of FIG. 6, an insulating material (e.g., 306) can be disposed above at least a portion of the one or more nanowires, the material, and the non-single crystal substrate. It is appreciated that operation 606 can be implemented in a wide variety of ways. For example, operation 606 can be implemented in any manner similar to that described herein, but is not limited to such.

At operation 608, an electrode (e.g., 302) can be coupled to the one or more nanowires for conducting current. It is understood that operation 608 can be implemented in a wide variety of ways. For example, operation 608 can be implemented in any manner similar to that described herein, but is not limited to such. At the completion of operation 608, process 600 can be exited. In this fashion, an apparatus can be fabricated that can include one or more nanowires in accordance with various embodiments of the invention. It is pointed out that the one or more nanowires of process 600 can be utilized for emitting light (or any electromagnetic wave) in accordance with various embodiments of the invention. Moreover, the one or more nanowires of process 600 can be utilized for absorbing light (or any electromagnetic wave) and generating a current in accordance with various embodiments of the invention. The apparatus of process 600 can be incorporated with a display device, radiation/light detector device, and/or a solar cell device, but is not limited to such.

Figure 7:
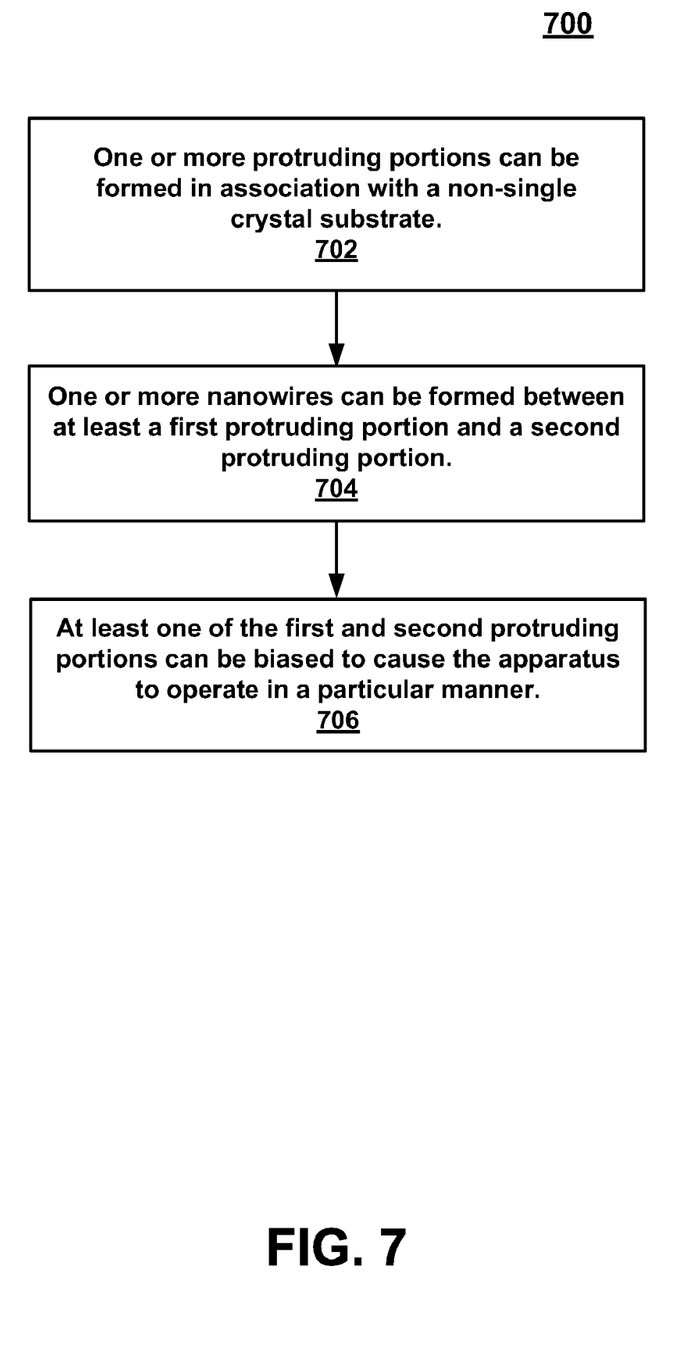
FIG. 7 is another flow diagram of a method in accordance with various embodiments of the invention.

FIG. 7 is a flow diagram of a method 700 for fabricating an apparatus that includes one or more nanowires in accordance with various embodiments of the invention. Method 700 includes exemplary processes of various embodiments of the invention that can be carried out by a processor(s) and electrical components under the control of computing device readable and executable instructions (or code), e.g., software. The computing device readable and executable instructions (or code) may reside, for example, in data storage features such as volatile memory, non-volatile memory and/or mass data storage that can be usable by a computing device. However, the computing device readable and executable instructions (or code) may reside in any type of computing device readable medium. Although specific operations are disclosed in method 700, such operations are exemplary. Method 700 may not include all of the operations illustrated by FIG. 7. Also, method 700 may include various other operations and/or variations of the operations shown by FIG. 7. Likewise, the sequence of the operations of method 700 can be modified. It is noted that the operations of method 700 can be performed by software, by firmware, by electronic hardware, or by any combination thereof.

Specifically, one or more protruding portions can be formed in association with a non-single crystal substrate. At least a first protruding portion and a second protruding portion can each include an electrode. One or more nanowires can be formed between at least the first protruding portion and the second protruding portion. In this manner, an apparatus can be fabricated that can include one or more nanowires in accordance with various embodiments of the invention. It is noted that at least one of the first and second protruding portions can be biased to cause the apparatus to operate in a particular manner.

At operation 702 of FIG. 7, one or more protruding portions (e.g., 104, 106, and the like) can be formed in association with a non-single crystal substrate. Note that operation 702 can be implemented in a wide variety of ways. For example, at least a first protruding portion and a second protruding portion can each include an electrode. It is appreciated that operation 702 can be implemented in any manner similar to that described herein, but is not limited to such.

At operation 704, one or more nanowires (e.g., 304) can be formed between at least the first protruding portion (e.g., 104) and the second protruding portion (e.g., 106). It is understood that operation 704 can be implemented in a wide variety of ways. For example, operation 704 can be implemented in any manner similar to that described herein, but is not limited to such. In this manner, an apparatus (e.g., 100, and the like) can be fabricated that can include one or more nanowires in accordance with various embodiments of the invention.

At operation 706 of FIG. 7, at least one of the first and second protruding portions can be biased to cause the apparatus to operate in a particular manner. It is appreciated that operation 706 can be implemented in a wide variety of ways. For example, operation 706 can be implemented in any manner similar to that described herein, but is not limited to such. At the completion of operation 706, process 700 can be exited. It is pointed out that the one or more nanowires of process 700 can be utilized for emitting light (or any electromagnetic wave) in accordance with various embodiments of the invention. Moreover, the one or more nanowires of process 700 can be utilized for absorbing light (or any electromagnetic wave) and generating a current in accordance with various embodiments of the invention. The apparatus of process 700 can be incorporated with a display device, radiation/light detector device, and/or a solar cell device, but is not limited to such.

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents

What is claimed is:

1. A solar cell comprising:
   a non-single crystal substrate;
   a nanowire grown from a surface of said non-single crystal substrate; and
   an electrode coupled to a top of said nanowire, wherein said nanowire is electrically conductive and is for absorbing an electromagnetic wave and generating a current; and
   wherein said non-single crystal substrate from which said nanowire is grown is electrically conductive, is coupled to a bottom of said nanowire, and provides an electrical contact at said bottom of said nanowire.

2. The solar cell of claim 1, wherein said non-single crystal substrate comprises polycrystalline silicon.

3. The solar cell of claim 1, wherein said non-single crystal substrate comprises amorphous silicon.

4. The solar cell of claim 1, wherein said non-single crystal substrate comprises microcrystalline silicon.

5. A method for fabricating a solar cell, the method comprising:
   growing a nanowire from a surface of a non-single crystal substrate; and
   coupling an electrode to a top of said nanowire for conducting current,
   wherein said nanowire is electrically conductive and for absorbing electromagnetic wave and generating a current; and
   wherein said non-single crystal substrate from which said nanowire is grown is electrically conductive, is coupled to a bottom of said nanowire, and provides an electrical contact at said bottom of said nanowire.

6. The method of claim 5, further comprising:
   disposing an insulating material above said non-single crystal substrate.

7. The method of claim 5, further comprising:
   disposing a material above said non-single crystal substrate, said material selected from the group consisting of polycrystalline silicon, poly-crystal diamond and related carbon-based materials, amorphous silicon, and microcrystalline silicon,
   wherein said nanowire is disposed above said material.

8. The method of claim 5, wherein said nanowire comprises a material selected from the group consisting of a metal, a group III-V compound semiconductor material and related alloys, a group II-VI compound semiconductor material and related alloys, and a group IV semiconductor material and related alloys.

9. The method of claim 5, further comprising:
   growing a plurality of nanowires above said non-single crystal substrate,
   wherein each nanowire of said plurality of nanowires has a random orientation.

10. A photovoltaic solar cell, comprising:
    a non-single crystal substrate;
    a plurality of nanowires grown from a surface of said non-single crystal substrate, each said nanowire having a bottom end crystallographically attached to said non-single crystal substrate and a top end opposite said bottom end, said plurality of nanowires extending outwardly from said non-single crystal substrate at generally random angles, wherein each said nanowire has a photovoltaic property in which solar electromagnetic waves incident thereon are at least partially absorbed to cause electrical current to flow therethrough; and
    an electrode coupled to said top end of each said nanowire of said plurality of nanowires; and wherein said non-single crystal substrate from which said plurality of nanowires is grown is electrically conductive, is coupled to a bottom end of each said nanowire of said plurality of nanowires, and provides an electrical contact at said bottom end of each said nanowire of said plurality of nanowires.

11. The photovoltaic solar cell of claim 10, wherein said non-single crystal substrate comprises at least one of polycrystalline silicon, amorphous silicon, and microcrystalline silicon.

12. The photovoltaic solar cell of claim 10, wherein each said nanowire comprises a material selected from the group consisting of: a Group III-V compound semiconductor material, an alloy related to a Group III-V compound semiconductor material, a Group II-VI compound semiconductor material, and an alloy related to a Group II-VI compound semiconductor material.

13. The photovoltaic solar cell of claim 10, further comprising an insulator material disposed between said non-single crystal substrate and said electrode such that it fills in gaps among said plurality of nanowires.

14. The photovoltaic solar cell of claim 10, wherein said non-single crystal substrate is at least partially transparent such that incident solar electromagnetic waves can propagate therethrough to impinge upon the plurality of nanowires.

15. The photovoltaic solar cell of claim 10, wherein said top ends of said nanowires are electrically connected to an external circuit through said electrode, and wherein said bottom ends of said nanowires are electrically connected to the external circuit through said non-single-crystal substrate, whereby said electrical current caused by absorption of said electromagnetic waves by said nanowires flows through said external circuit.

* * * * *